(12) United States Patent
Oi

(10) Patent No.: US 7,750,691 B1
(45) Date of Patent: Jul. 6, 2010

(54) CLOCK DRIVER CIRCUIT

(75) Inventor: Yin Wan Oi, Penang (MY)

(73) Assignee: Motorola, Inc., Schaumburg, IL (US)

( * ) Notice: Subject to any disclaimer, the term of this patent is extended or adjusted under 35 U.S.C. 154(b) by 4 days.

(21) Appl. No.: 12/340,658

(22) Filed: Dec. 20, 2008

(51) Int. Cl.
*H03B 1/00* (2006.01)

(52) U.S. Cl. ........................... 327/112; 327/261

(58) Field of Classification Search ............... 327/108, 327/112, 261, 266, 274, 280
See application file for complete search history.

(56) References Cited

U.S. PATENT DOCUMENTS

| 5,596,296 | A * | 1/1997 | Asazawa | 327/291 |
| 5,854,567 | A * | 12/1998 | Meier et al. | 327/437 |
| 6,366,140 | B1 * | 4/2002 | Warwar | 327/108 |
| 6,583,656 | B1 * | 6/2003 | Liu | 327/170 |
| 7,521,978 | B2 * | 4/2009 | Kim et al. | 327/291 |

* cited by examiner

*Primary Examiner*—Hai L Nguyen
(74) *Attorney, Agent, or Firm*—Terri S. Hughes

(57) ABSTRACT

Clock driver circuit having upper and lower transistors$_1$ and upper and lower transistors$_2$. Voltage node$_1$ coupled to electrodes of upper transistor$_1$ and upper transistor$_2$. Voltage node$_2$ coupled to electrodes of lower transistor$_1$ and lower transistor$_2$. Coupling transistor$_1$ couples another electrode of upper transistor$_1$ to another electrode of lower transistor$_2$. Coupling transistor$_2$ couples another electrode of upper transistor$_2$ to another electrode of lower transistor$_1$. Two series$_1$ capacitors couple the another electrode of upper transistor$_1$ to the another electrode of lower transistor$_1$. Two series$_2$ capacitors couple the another electrode of upper transistor$_2$ to the another electrode of lower transistor$_2$. Node intermediate the two series$_2$ capacitors provides in-phase clock output. Node intermediate the two series$_1$ capacitors provides anti-phase clock output. In-phase clock input is coupled to control inputs of upper transistor$_1$, coupling transistor$_1$ and lower transistor$_1$. Anti-phase clock input is coupled to control inputs of upper transistor$_2$, coupling transistor$_2$ and lower transistor$_2$.

12 Claims, 4 Drawing Sheets

CLOCK DRIVER CIRCUIT

FIELD OF THE INVENTION

The present invention relates generally to clock driver circuits.

BACKGROUND OF THE INVENTION

Differential clock drivers are normally used to drive relatively small loads. Capacitive coupling is widely used to enable high data or clock rate interconnection between circuits, such as integrated circuits (ICs). Capacitive coupling (by use of coupling capacitors) typically simplifies circuit design by blocking direct current (D.C.) biasing from being superimposed at output lines, and thus, being supplied to a load. Capacitive coupling also can be used to isolate ground connections between subsystems for noise isolation purposes. However, although capacitive coupling is beneficial when used, for instance, in a differential clock driver circuit, their supply voltage charge to zero voltage discharge may affect the bandwidth of the driver. To overcome this potential bandwidth restriction, differential clock drivers can be configured to have increased peak currents at their outputs to thereby more rapidly charge and discharge their coupling capacitors. As a result, prior art differential clock drivers coupled to respective loads by respective coupling capacitors are typically configured and operated by compromising between clock speed, signal quality and power consumption.

BRIEF DESCRIPTION OF THE DRAWINGS

In order that the invention may be readily understood and put into practical effect, reference will now be made to exemplary embodiments as illustrated with reference to the accompanying figures, wherein like reference numbers refer to identical or functionally similar elements throughout the separate views. The figures together with a detailed description below, are incorporated in and form part of the specification, and serve to further illustrate the embodiments and explain various principles and advantages, in accordance with the present invention, where.

Figure 1:
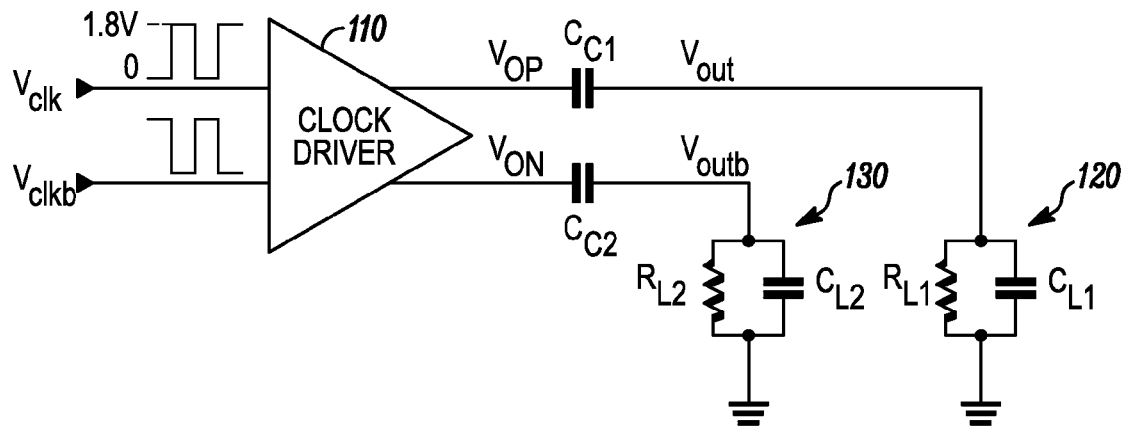
FIG. 1 illustrates a schematic diagram of circuit that includes a prior art differential clock driver.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail embodiments that are in accordance with the present invention, it should be observed that the embodiments reside primarily in circuit components. Accordingly, the circuit components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," "including," "includes," or any other variation thereof, are intended to cover a non-exclusive inclusion, such that circuit components that comprises a list of elements does not include only those elements but may include other elements not expressly listed or inherent to such a circuit component. An element proceeded by "comprises . . . a" does not, without more constraints, preclude the existence of additional identical elements in the circuit that comprises the element.

Referring to FIG. 1, there is illustrated a schematic diagram of circuit 100 that includes a prior art differential clock driver 110 with two outputs $V_{OP}$, $V_{ON}$ coupled to a respective load 120, 130 by respective coupling capacitors $C_{C1}$, $C_{C2}$. The differential clock driver 110 has two clock inputs, a first one being an in-phase clock signal input Vclk, and a second one being an anti-phase clock signal input Vclkb. In use, an anti-phase clock signal ACS applied to the anti-phase clock signal input Vclkb has the same frequency and amplitude as an in-phase clock signal ICS applied to the in-phase clock signal input Vclk. However, as shown, the anti-phase clock signal ACS is out-of-phase with the in-phase clock signal ICS by 180 degrees. In this regard, and for the rest of the specification, the term in-phase clock signal has the meaning of a reference signal relative to the phase of the anti-phase clock signal ACS.

The differential clock driver 110 also has two outputs, the first one being an in-phase clock signal output $V_{OP}$, and a second one being an anti-phase clock signal output $V_{ON}$. A first coupling capacitor $C_{C1}$ has an input electrode coupled to the in-phase clock signal output $V_{OP}$, a second electrode of the first coupling capacitor $C_{C1}$ provides a coupled in-phase output Vout that is coupled to a first load 120. A second coupling capacitor $C_{C2}$ has an input electrode coupled to the anti-phase clock signal output $V_{ON}$, a second electrode of the second coupling capacitor $C_{c2}$ provides a coupled anti-phase output Voutb that is coupled to a second load 130. As will be apparent to a person skilled in the art, both loads 120, 130 model a typical impedance of a typical integrated circuit that can be coupled to the differential clock driver 110. As shown by way of example, the first load 120 includes a parallel resistor capacitor network of a capacitor $C_{L1}$ in parallel with a resistor $R_{L1}$. Also as shown by way of example, the second load 130 includes a parallel resistor capacitor network of a capacitor $C_{L2}$ in parallel with a resistor $R_{L2}$.

Figure 2:
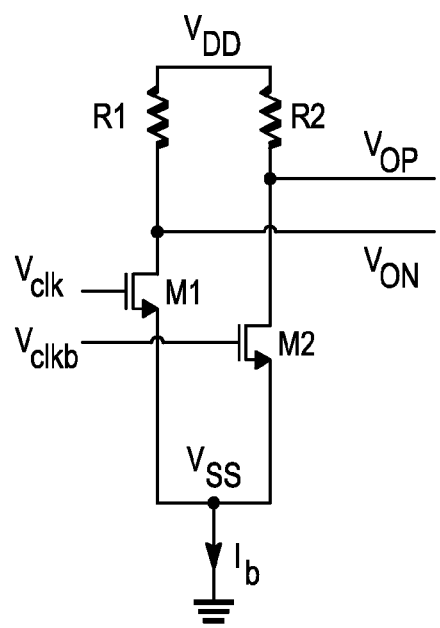
FIG. 2 illustrates a schematic diagram of a typical circuit for the prior art differential clock driver of FIG. 1.

Referring to FIG. 2, there is illustrated a schematic diagram of a typical circuit for the prior art differential clock driver 110. The prior art differential clock driver 110 has a first resistor R1 coupling a drain electrode of a first transistor M1 to a supply voltage rail VDD. A source electrode of the first transistor M1 is directly coupled to ground (VSS), and a gate electrode of the first transistor M1 is coupled to the in-phase clock signal input Vclk. The drain electrode of the first transistor M1 is also coupled to the anti-phase clock signal output $V_{ON}$. The prior art differential clock driver 110 also has a second resistor R2 coupling a drain electrode of a second transistor M2 to the supply voltage rail VDD. A source electrode of the second transistor M2 is directly coupled to ground (VSS) and a gate electrode of the second transistor M2 is coupled to the anti-phase clock signal input Vclkb. The drain electrode of the second transistor M2 is also coupled to the in-phase clock signal output $V_{OP}$.

The circuit 100 has a prior art differential clock driver 110 coupled to a respective load 120, 130 by respective coupling capacitors $C_{C1}$, $C_{C2}$ illustrated in FIGS. 1 and 2 has an in-phase output Vout (peak) that is proportional to $C_{C1}/C_{L1}$, and similarly, the anti-phase output Voutb (peak) is proportional to $C_{C2}/C_{L2}$. The size of the coupling capacitors $C_{C1}$ and $C_{C2}$ are therefore determined by impedances of their respective loads 120, 130 and minimum required clock signal frequency. For wideband applications that typically require, for example, clock signals of 100 MHz to 1 GHz, the value of the coupling capacitors $C_{C1}$ and $C_{C2}$ will be a few Pico-Farads. Larger coupling capacitors $C_{C1}$ and $C_{C2}$ will result better output signal quality of the in-phase output Vout and anti-phase output Voutb at the expense of longer settling times which limits the frequency response of the differential clock driver 110. However, the settling time can be reduced by increasing the peak currents at the output of the differential clock driver 110, thereby more rapidly charging and discharging the coupling capacitors $C_{C1}$ and $C_{C2}$. Hence, the prior art differential clock drivers 110 coupled to respective loads 120, 130 by respective coupling capacitors $C_{C1}$ and $C_{C2}$ are typically configured and operated by compromising between clock speed, signal quality and power consumption.

According to one aspect of the disclosure, there is provided a clock driver circuit with a first upper transistor and a first lower transistor that provide a first set of complementary transistors. There is a second upper transistor and a second lower transistor that provide a second set of complementary transistors. A first voltage supply node is coupled to both an electrode of the first upper transistor and an electrode of the second upper transistor, and a second voltage supply node coupled to both an electrode of the first lower transistor and an electrode of the second lower transistor. A first coupling transistor selectively couples another electrode of the first upper transistor to another electrode of the second lower transistor, and a second coupling transistor selectively couples another electrode of the second upper transistor to another electrode of the first lower transistor. There are two first series connected capacitors coupling the another electrode of the first upper transistor to the another electrode of the first lower transistor, and two second identical series connected capacitors couple the another electrode of the second upper transistor to the another electrode of the second lower transistor. An in-phase clock signal output is provided by a node intermediate the two second series connected capacitors and an anti-phase clock signal output is provided by a node intermediate the two first series connected capacitors. An in-phase clock signal input is coupled to control inputs of the first upper transistor, the first coupling transistor and the first lower transistor. Also, an anti-phase clock signal input is coupled to control inputs of the second upper transistor, the second coupling transistor and the second lower transistor.

Figure 3:
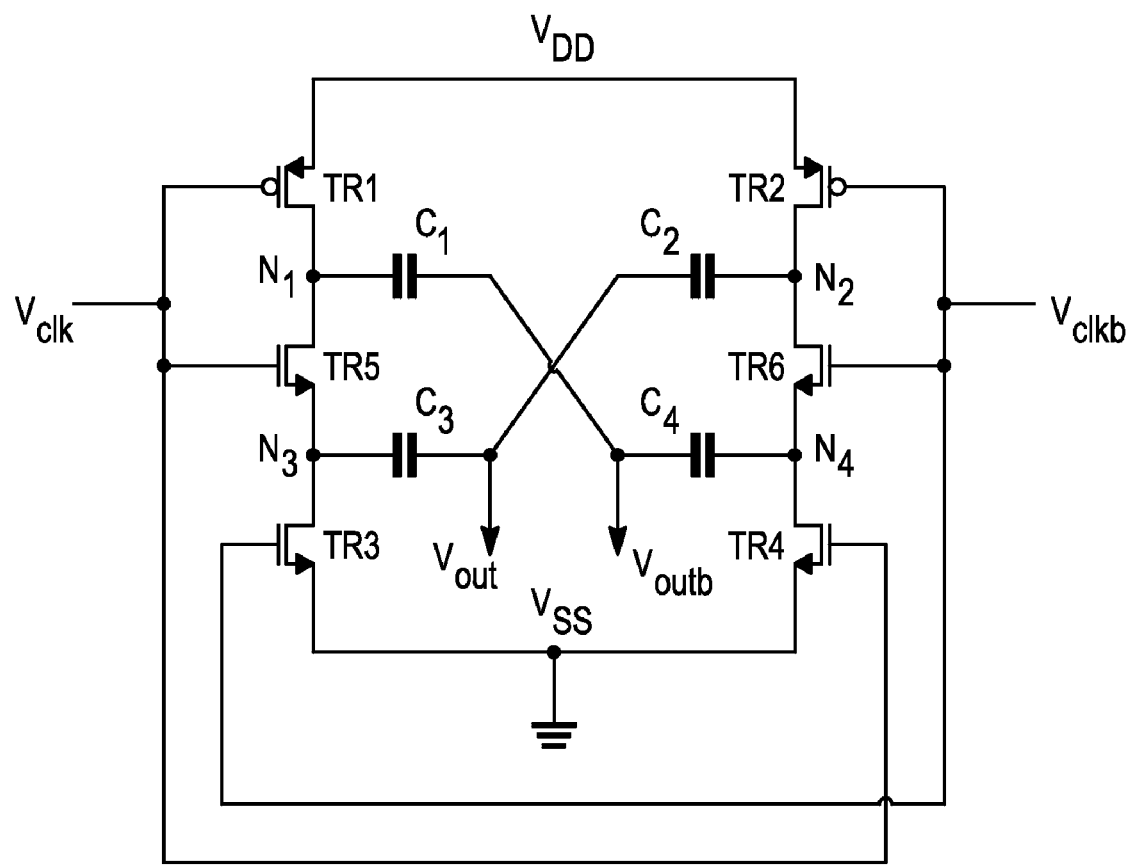
FIG. 3 illustrates a schematic diagram of a clock driver circuit in accordance with an embodiment of the present invention.

Referring to FIG. 3, there is illustrated a schematic diagram of a first embodiment of a clock driver circuit 300 comprising a first upper transistor TR1 and a first lower transistor TR4 that provide a first set of complementary transistors. There is also a second upper transistor TR2 and a second lower transistor TR3 that provide a second set of complementary transistors. A first voltage supply node VDD is coupled to both an electrode of the first upper transistor TR1 and an electrode of the second upper transistor TR2. Also, a second voltage supply node VSS is coupled to both an electrode of the first lower transistor TR3 and an electrode of the second lower transistor TR4. More specifically, the first upper transistor TR1 has a source electrode coupled to the first voltage supply node VDD and the first lower transistor TR4 has a source electrode coupled to the second voltage supply node VSS. The second upper transistor TR2 has a source electrode coupled to the first voltage supply node VDD and the second lower transistor TR3 has a source electrode coupled to the second voltage supply node VSS.

The clock driver circuit 300 also has a first coupling transistor TR5 selectively coupling another electrode (the drain electrode) of the first upper transistor TR1 to another electrode (the drain electrode) of the second lower transistor TR3. There is also a second coupling transistor TR6 selectively coupling another electrode (the drain electrode) of the second upper transistor TR2 to another electrode (the drain electrode) of the first lower transistor TR4. Two first series connected capacitors C1, C4 couple the drain electrode of the first upper transistor TR1 to the drain electrode of the first lower transistor TR4, and two second series connected capacitors C2, C3 couple the drain electrode of the second upper transistor TR2 to the drain electrode of the second lower transistor TR3.

The clock driver circuit 300 also comprises an anti-phase clock signal output Voutb provided by a node intermediate the two first series connected capacitors C1,C4 and an in-phase clock signal output Vout provided by a node intermediate the two second series connected capacitors C2,C3. There is an in-phase clock signal input Vclk coupled to control inputs of the first upper transistor, the first coupling transistor and the first lower transistor. There is also an anti-phase clock signal input Vclkb coupled to control inputs of the second upper transistor, the second coupling transistor and the second lower transistor. As will be apparent to a person skilled in the art, since the upper first transistor TR1 and upper second transistor TR2 are P-type field effect transistors and the lower first transistor TR4, lower second transistor TR3, the first coupling transistor TR5 and the second coupling transistor TR6 are N-type field effect transistors, then all of the above-mentioned control inputs are gate electrodes.

The first voltage supply node VDD is coupled to a positive supply potential and the second voltage supply node VSS is coupled to a reference potential (typically ground reference) relative to the positive power supply VDD. In operation, a first clock signal Ck is applied to the in-phase clock signal input Vclk and second clock signal Ckb that is anti-phase to the first clock signal Ck is applied to the anti-phase clock signal input Vcklb. The two first series connected capacitors C1, C4 and the two second series connected capacitors C2, C3 all have identical capacitance values, and the two first series connected capacitors include a lower first capacitor C4 coupled to the another electrode of the first lower transistor TR4 and an upper first capacitor C1 coupled to the another electrode of the first upper transistor TR1. The two first series connected capacitors C2, C3 include a lower second capacitor C3 coupled to the another electrode of the second lower transistor TR3 and an upper second capacitor C2 coupled to the another electrode of the second upper transistor TR2.

Figure 4:
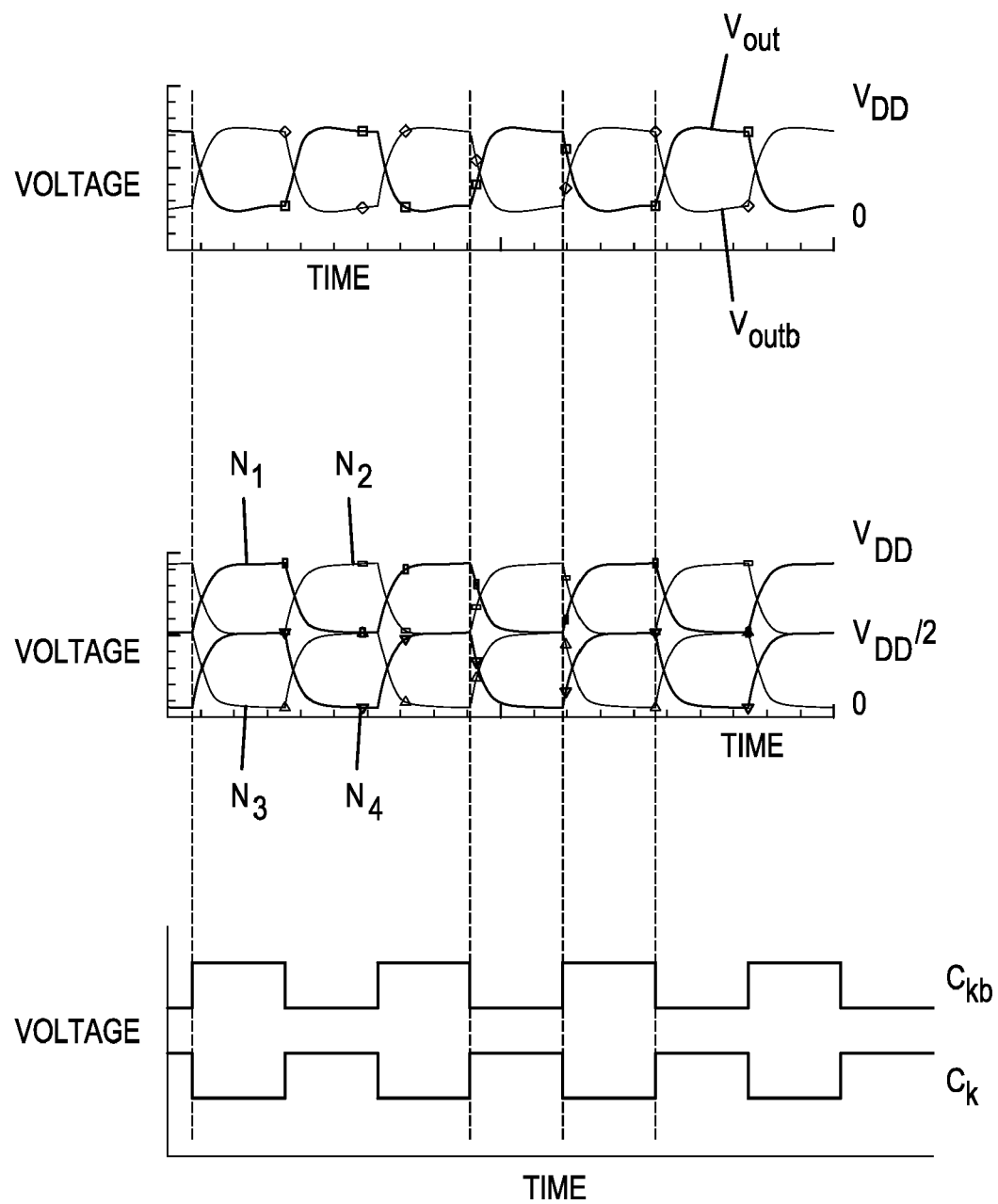
FIG. 4 is a waveform diagram illustrating voltages at nodes in the clock driver circuit of FIG. 3 in accordance with an embodiment of the present invention.

Illustrated in FIG. 4 is a waveform diagram illustrating voltages at nodes N1 to N4 in the clock driver circuit 300. Referring to both FIGS. 3 and 4, the operation of the clock driver circuit 300 will now be described. When a clock signal Ck at the clock signal input Clk has just transitioned to a logic 0 (Zero Volts) and an anti-phase clock signal CKb has just transitioned to a logic 1 (1.8 Volts), then at this instance (assuming VDD=1.8 Volts), the voltage at N1=0.9V, the voltage at N2=1.8V, the voltage at N3=0.9V, and the voltage at N4=0V. After the transition, the first upper transistor TR1 is switched on, the first lower transistor TR4 is switched off and the first coupling transistor TR5 is also switched off. Also, the second upper transistor TR2 is switched off, the second lower transistor TR3 is switched on and the second coupling transistor TR6 is also switched on. As a result, the voltage at N1 will charge up to the supply voltage VDD=1.8V, the voltage at N2 stored on the upper second capacitor C2 will discharge to share its charge with lower first capacitor C4, and thus, the voltage at N2=0.9V. The voltage at N3 will discharge to ground, and thus, N3=0V, and the voltage at N4 stored on the lower first capacitor C4 will charge to share the charge of the upper second capacitor C2, and thus, N4=N2=0.9V.

After the clock signal Ck at the clock signal input Clk has just transitioned to a logic 1 (1.8 Volts) and the anti-phase clock signal CKb has just transitioned to a logic 0 (0 Volts), then the first upper transistor TR1 is switched off, the first lower transistor TR4 is switched on and the first coupling transistor TR5 is also switched on. Also, the second upper transistor TR2 is switched on, the second lower transistor TR3 is switched off and the second coupling transistor TR6 is also switched off. As a result, the voltage at N1 stored on the upper first capacitor C1 will discharge to share its charge with lower second capacitor C3, and thus, the voltage at N1=0.9V. The voltage at N2 will charge up to the supply voltage VDD=1.8V. The voltage at N3 stored on the lower second capacitor C3 will charge to share the charge of the upper first capacitor C1, and thus, N3=N1=0.9V and voltage at N4 will discharge to ground, and thus, N4=0V.

From analysis of the above, in operation a charge on the lower first capacitor C4 ranges from the reference potential (VSS or ground) to half the positive power supply potential (VDD/2), and the charge on the upper first capacitor C1 ranges from to half the positive power supply potential (VDD/2) to the positive power supply potential (VDD). Similarly, in operation, a charge on the lower second capacitor C3 ranges from the reference potential (VSS or ground) to half the positive power supply potential (VDD/2), and the charge on the upper second capacitor C2 ranges from to half the positive power supply potential (VDD/2) to the positive power supply potential (VDD). Thus, the charging and discharging of capacitors C1, C2, C3 and C4 results in the waveforms illustrated for Vout and Voutb that range from VDD to VSS or ground.

Figure 5:
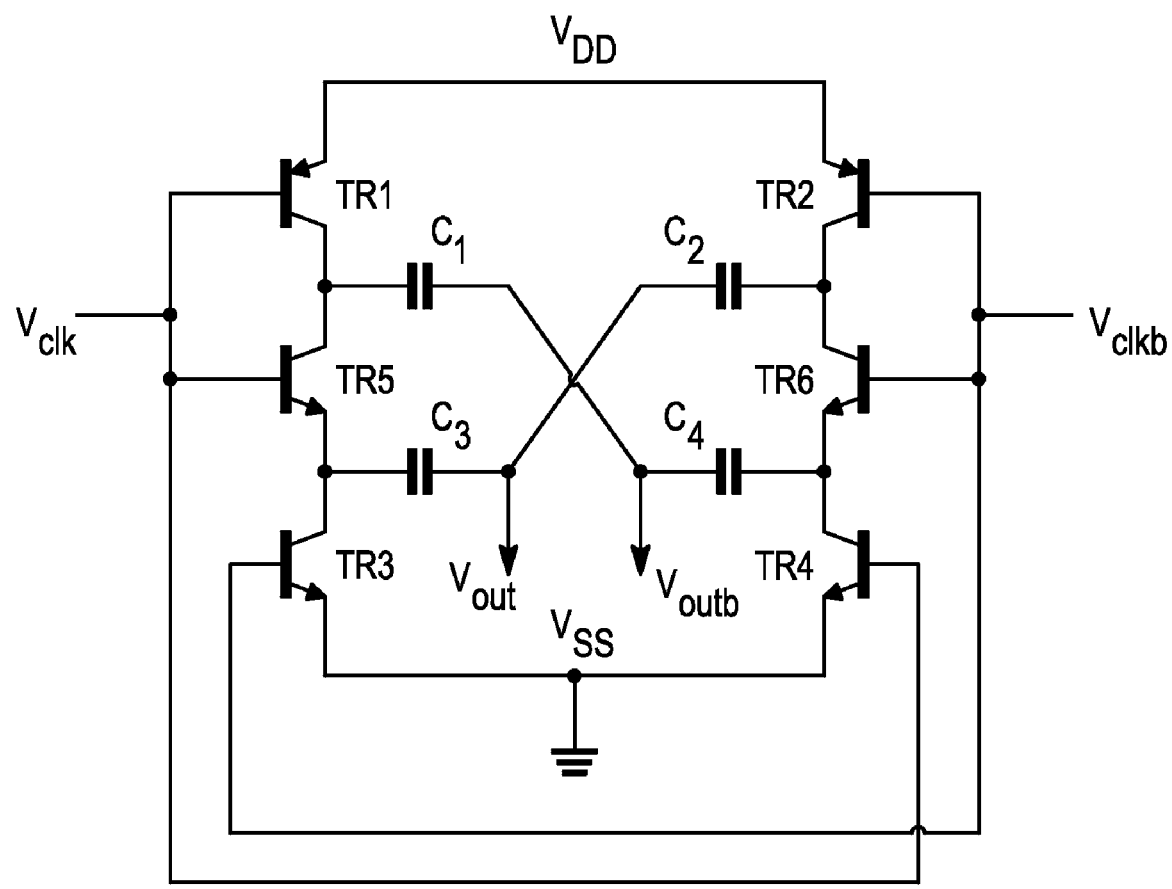
FIG. 5 illustrates a schematic diagram of a clock driver circuit in accordance with an embodiment of the present invention.

Referring to FIG. 5, there is illustrated a further embodiment of a clock driver circuit 500. This clock driver circuit has the same structure as the clock driver circuit 300, the only difference is that the upper first transistor TR1 and upper second transistor TR2 are PNP bipolar transistors, the lower first transistor TR4 and lower second transistor TR3 are NPN bipolar transistors, and the first coupling transistor TR5 and the second coupling transistor TR6 are NPN bipolar transistors. The clock driver circuit 500 functions the same as the clock driver circuit 300, and to avoid repetition, the operation of the clock driver circuit 500 will not be described.

Advantageously, the first upper and first lower transistors TR1, TR4 are configured and biased to operate in a class AB operation so that only one transistor can be turned on at any instance, thereby eliminating the possibility of shorting the supply voltage to ground. Similarly, the second upper and second lower transistors TR2, TR3 are configured and biased to operate in a class AB operation. The present invention provides for a split level charging/discharging using capacitors C1 to C4, and thus, these capacitors maximum discharge voltage range, resulting from a clock signal transition, is VDD/2. The present invention therefore provides clock driver faster output response times at Vout and Voutb with reduced power consumption.

In the foregoing specification, specific embodiments of the present invention have been described. However, one of ordinary skill in the art appreciates that various modifications and changes can be made without departing from the scope of the present invention as set forth in the claims below. For instance all N-type transistors of FIG. 3 could be replaced with P-type transistors, and all P-type transistors could be replaced with N-type transistors. Similarly, all NPN bipolar transistors of FIG. 5 could be replaced with PNP bipolar transistors, and all PNP bipolar transistors could be replaced with NPN bipolar transistors. Accordingly, the specification and figures are to be regarded in an illustrative rather than a restrictive sense, and all such modifications are intended to be included within the scope of the present invention. The benefits, advantages, solutions to problems, and any elements that may cause any benefit, advantage, or solution to occur or become more pronounced are not to be construed as critical, required, or essential features or elements of any or all of the claims. The invention is defined solely by the appended claims including any amendments made during the pendency of this application and all equivalents of those claims.

I claim:

1. A clock driver circuit comprising:
   a first upper transistor and a first lower transistor providing a first set of complementary transistors;
   a second upper transistor and a second lower transistor providing a second set of complementary transistors;
   a first voltage supply node coupled to both an electrode of the first upper transistor and an electrode of the second upper transistor;
   a second voltage supply node coupled to both an electrode of the first lower transistor and an electrode of the second lower transistor;
   a first coupling transistor selectively coupling another electrode of the first upper transistor to another electrode of the second lower transistor;
   a second coupling transistor selectively coupling another electrode of the second upper transistor to another electrode of the first lower transistor;
   two first series connected capacitors coupling the another electrode of the first upper transistor to the another electrode of the first lower transistor;
   two second identical series connected capacitors coupling the another electrode of the second upper transistor to the another electrode of the second lower transistor;
   an in-phase clock signal output provided by a node intermediate the two second series connected capacitors;
   an anti-phase clock signal output provided by a node intermediate the two first series connected capacitors;
   an in-phase clock signal input coupled to control inputs of the first upper transistor, the first coupling transistor and the first lower transistor; and
   an anti-phase clock signal input coupled to control inputs of the second upper transistor, the second coupling transistor and the second lower transistor.

2. A clock driver circuit as claimed in claim 1, wherein the upper first transistor and upper second transistor are P-type field effect transistors and wherein the lower first transistor and lower second transistor are N-type field effect transistors.

3. A clock driver circuit, as claimed in claim 2, wherein the first coupling transistor and the second coupling transistor are N-type field effect transistors.

4. A clock driver circuit, as claimed in claim 3, wherein the first coupling transistor and the second coupling transistor are NPN bipolar transistors.

5. A clock driver circuit, as claimed in claim 1, wherein the upper first transistor and upper second transistor are PNP bipolar transistors, and wherein the lower first transistor and lower second transistor are NPN bipolar transistors.

6. A clock driver circuit, as claimed in claim 1, wherein the two first series connected capacitors and the two second series connected capacitors all have identical capacitance values.

7. A clock driver circuit, as claimed in claim 1, wherein the first voltage supply node is coupled to a positive power supply potential and the second voltage supply node is coupled to a reference potential relative to the positive power supply.

8. A clock driver circuit, as claimed in claim 7, wherein in operation a first clock signal is applied to the in-phase clock signal input and second clock signal that is anti-phase to the first clock signal is applied to the anti-phase clock signal input.

9. A clock driver circuit, as claimed in claim 7, wherein the two first series connected capacitors and the two second series connected capacitors all have identical capacitance values and the two first series connected capacitors include a lower first capacitor coupled to the another electrode of the first lower transistor and an upper first capacitor coupled to the another electrode of the first upper transistor, and wherein in operation a charge on the lower first capacitor ranges from the reference potential to half the positive power supply potential and the charge on the upper first capacitor ranges from to half the positive power supply potential to the positive power supply potential.

10. A clock driver circuit, as claimed in claim 9, wherein in operation a charge on the lower second capacitor ranges from the reference potential to half the positive power supply potential and the charge on the upper second capacitor ranges from to half the positive power supply potential to the positive power supply potential.

11. A clock driver circuit, as claimed in claim 1, wherein the first upper transistor and first lower transistor are configured and biased to operate in a class AB operation.

12. A clock driver circuit, as claimed in claim 1, wherein the second upper transistor and first lower transistor are configured and biased to operate in a class AB operation.

* * * * *

UNITED STATES PATENT AND TRADEMARK OFFICE
CERTIFICATE OF CORRECTION

Page 1 of 1

PATENT NO.       : 7,750,691 B1
APPLICATION NO.  : 12/340658
DATED            : July 6, 2010
INVENTOR(S)      : Oi It is certified that error appears in the above-identified patent and that said Letters Patent is hereby corrected as shown below:

On the Title Page, below Item (22), insert Item -- (65) Prior Publication Data US 2010/0156473 A1 Jun. 24, 2010 --.

In Column 6, Line 61, in Claim 2, delete "circuit as" and insert -- circuit, as --, therefor.

Signed and Sealed this
Twenty-seventh Day of November, 2012

David J. Kappos
*Director of the United States Patent and Trademark Office*